United States Patent [19]

Michaelis

[11] 4,275,459

[45] Jun. 23, 1981

[54] MAGNETIC BUBBLE DETECTOR ARRANGEMENT

[75] Inventor: Paul C. Michaelis, Watchung, N.J.

[73] Assignee: Bell Telephone Laboratories, Incorporated, Murray Hill, N.J.

[21] Appl. No.: 162,373

[22] Filed: Jun. 23, 1980

[51] Int. Cl.³ .......................................... G11C 19/08
[52] U.S. Cl. ................................................... 365/8
[58] Field of Search .................................... 365/8, 43

[56] References Cited

U.S. PATENT DOCUMENTS 3,713,120  1/1973  Bobeck et al. ........................... 365/8

OTHER PUBLICATIONS

IBM Technical Disclosure Bulletin–vol. 19, No. 7, Dec. 1976, pp. 2797–2799.

Primary Examiner—James W. Moffitt
Attorney, Agent, or Firm—Herbert M. Shapiro

[57] ABSTRACT

A permalloy detector for a magnetic bubble memory employs a stack of chevron elements astride the bubble path. Alternate ones of the elements are positioned at an angle to the path of bubble propagation smaller than the angle at which the remaining elements are positioned. The result is that one set of elements moves a stretched bubble to a position at which the remaining elements accomplish detection. The result is a clearer output signal which is relatively easy to detect.

7 Claims, 11 Drawing Figures

MAGNETIC BUBBLE DETECTOR ARRANGEMENT

FIELD OF THE INVENTION

This invention relates to magnetic bubble memories and more particularly to magnetoresistive detectors for such memories.

BACKGROUND OF THE INVENTION

Magnetic bubble memories are well known in the art. The most common detector for detecting magnetic bubbles is an expansion detector of the type disclosed in A. H. Bobeck, F. J. Ciak, and W. Strauss, U.S. Pat. No. 3,702,995, issued Nov. 14, 1972. That patent discloses a detector which is defined by a column of chevron-shaped elements operative to expand a bubble along an axis transverse to that along which a bubble moves. Both bubble movement and expansion are due to a pattern of magnetic elements, commonly composed of magnetically soft permalloy, in response to a reorienting in-plane magnetic field as is well known.

Considerable attention has been directed at the geometry of the elements which define the detector in order to improve the output signal when a bubble is detected, and to reduce the effect of the in-plane field on the elements. Pat. No. 4,019,177 of T. J. Nelson, issued Apr. 19, 1977, covers one contribution in this area. In that patent, the cross-sectional area of the upstream legs of the chevron elements defining the detector was reduced. In this connection, "upstream" indicates the direction from which bubbles advance. Thus, the term "upstream legs" indicates the legs which are closer to the origin of the bubbles. Similarly, U.S. Pat. No. 4,085,453 of A. H. Bobeck, P. I. Bonyhard, and T. J. Nelson, issued Apr. 18, 1978 discloses an "F" shaped element designed to eliminate unwanted poles which are formed in the more common chevron elements of the detector. These various designs concerned themselves primarily with the positioning of the detector elements to maximize the response to an expanded bubble being moved past the elements. The problem with prior art designs is that the detection elements, although perhaps optimized to respond to a bubble also simultaneously operate to move bubbles thus introducing unwanted noise.

BRIEF DESCRIPTION OF THE INVENTION

The invention is based on the recognition that consecutive permalloy magnetoresistive elements of a chevron expansion detector can be oriented at varied angles to the direction of bubble propagation to position an expanded bubble during one phase of a detection interval to control the switching of other detection elements optimized to provide the major magnetoresistive change during a later phase of a detection interval. In one specific embodiment, alternate elements of a set of chevron-shaped elements are oriented to generate poles attractive to bubbles at a time in the rotating field earlier than that at which adjacent elements generate poles. The bubble strip is elongated between the early-formed poles for altering the fields associated with the later-formed poles in a particularly sensitive manner. In another embodiment, sets of consecutively processed chevron elements with legs of differing lengths are organized for maximizing both the bubble strip position for optimum interaction during a detection interval and the element shape for responding to the strip.

DETAILED DESCRIPTION

Figure 1:
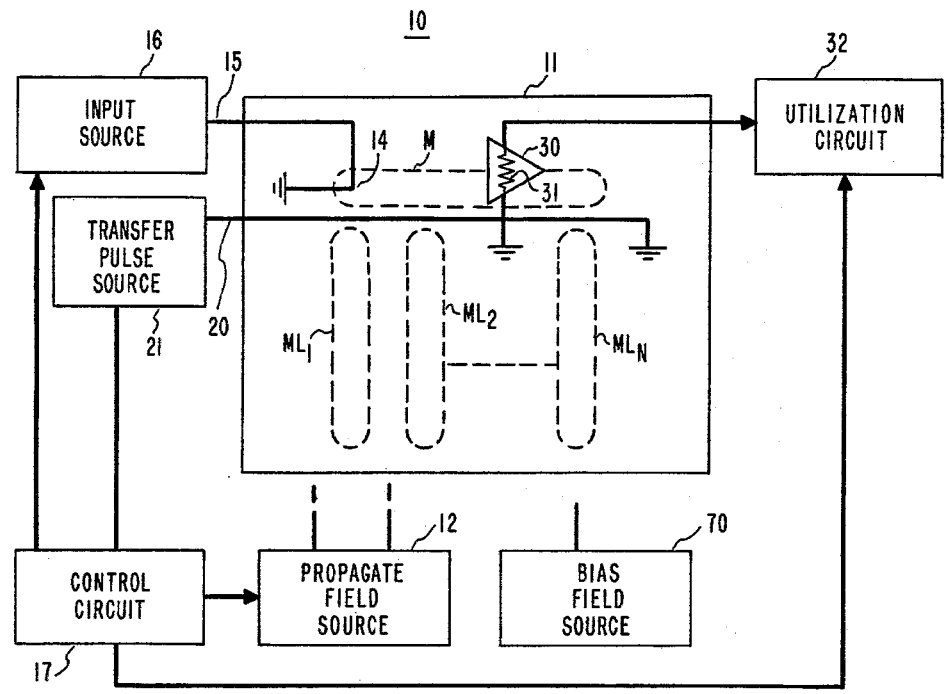
FIG. 1 shows a schematic block diagram of a magnetic bubble memory in accordance with this invention.

FIG. 1 shows a magnetic bubble memory 10 comprising a layer of material 11 in which magnetic bubbles can be moved along paths defined typically by permalloy elements. In the most common bubbles devices, the paths are organized in a major and minor organization. Characteristic of such an organization is a plurality of closed loop paths represented by broken oval-shaped lines designated $ML_1$, $Ml_2$... $ML_N$ about which bubble patterns recirculate in response to a magnetic drive (or propagate) field rotating in the plane of layer 11. A source of such a drive field is represented by block 12 in FIG. 1.

The closed loop paths are serviced by an accessing path called the major path or loop designated M in the figure. A bubble pattern is generated at 14 in the major path by a pulse selectively applied to a generate conductor 15 by an input source 16 in a manner synchronized to the drive field cycles by a control circuit 17. During a write operation, bubbles so generated are moved into vacancies created in the minor loops during a prior read operation as will become clear hereinafter. Such a transfer operation occurs in response to a pulse applied to transfer conductor 20 by a transfer pulse source 21 again synchronized to the drive field cycles by control circuit 17.

Similarly, a bubble pattern stored in a selected address of the minor loops are moved to positions from which transfer to the major path is possible. At that juncture, conductor 20 is again pulsed in a manner to move bubbles to the major path for movement to an expansion detector arrangement 30 in path M. Arrangement 30 includes a magnetoresistive detector 31 connected between a utilization circuit 32 and ground. Bubbles moving along the major path generate signals in detector 31 to be applied to utilization circuit 32.

Typically, detector 31 and a dummy detector (not shown) are connected into a bridge arrangement as is well known in order to reduce noise induced particularly by the drive field. Also, frequently, read and write operations are accomplished at opposite ends of the minor loops. In such arrangements, two independent major paths are utilized along with separate transfer implementations for transfer-in and transfer-out of bubble positions. Such arrangements are well known and are not discussed in detail herein. Suffice it to say that the major path into which bubbles are moved during a read operation in such an arrangement includes an expansion detector as does the arrangement of FIG. 1, and it is to the detector arrangement that we now turn our attention.

The detector arrangement comprises a succession of bubble propagation stages each including a number of chevron elements stacked transverse to the path of propagation. Successive stages include increasing numbers of elements operative in response to the drive field to expand bubbles as the bubbles propagate along the path. The increasing numbers of elements are represented by the triangular shape of the arrangement 30 as shown in FIG. 1.

The stage with the maximum number of elements usually includes the detector. In this stage, adjacent elements (chevrons) are linked to one another to form an electrically conducting path. The ends of the paths are connected between the utilization circuit 32 and ground as shown in FIG. 1. A standard expansion detector of this form integrated into a guard rail is disclosed in U.S. Pat. No. 3,810,132 of A. H. Bobeck, issued May 7, 1974.

Figure 2:
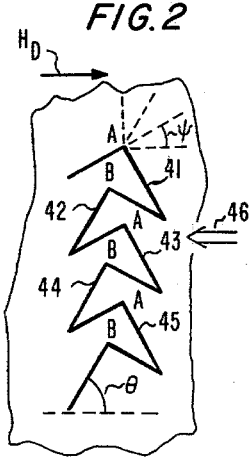
FIGS. 2, 3, 4, and 5 show enlarged top views of portions of the detector arrangement of the memory of FIG. 1.
Figure 3:
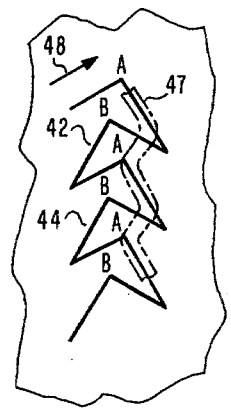

FIG. 2 shows a portion of the detector 31 of FIG. 1. An illustrative five elements, 41, 42, 43, 44, and 45, are shown. Elements 41, 43, and 45 are positioned at an angle $\Psi$ with respect to the direction of bubble movement which is represented by arrow 46. Elements 42 and 44 are positioned at an angle $\theta$ with respect to the direction of bubble movement where $\theta < \Psi$. The elements are positioned so that the centers or peaks A of chevron elements 41, 43, and 45 become attractive to bubbles earlier than the peaks B of elements 42 and 44. Because of the positioning of the elements as shown, the bubble 47 is stretched between poles at peaks A when the drive field is oriented in a direction represented by an arrow 48 in FIG. 3. The stretched bubble in the position shown in FIG. 3 affects the local fields of chevrons 42 and 44, particularly of the upstream legs (to the right) of those elements when the drive field $H_D$ reorients counterclockwise to a position aligned with legs 50 of elements 42 and 44 as shown by arrow 51 of FIG. 4. The bubble strip is now in a position shown at 53 in FIG. 5.

Figure 4:
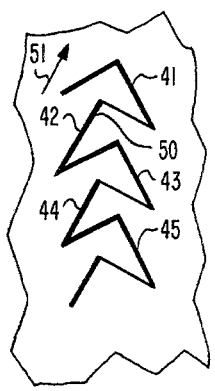
Figure 5:
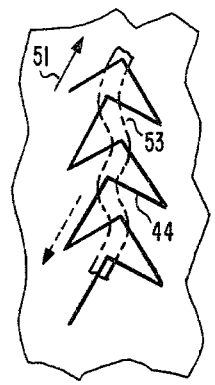
Figure 6:
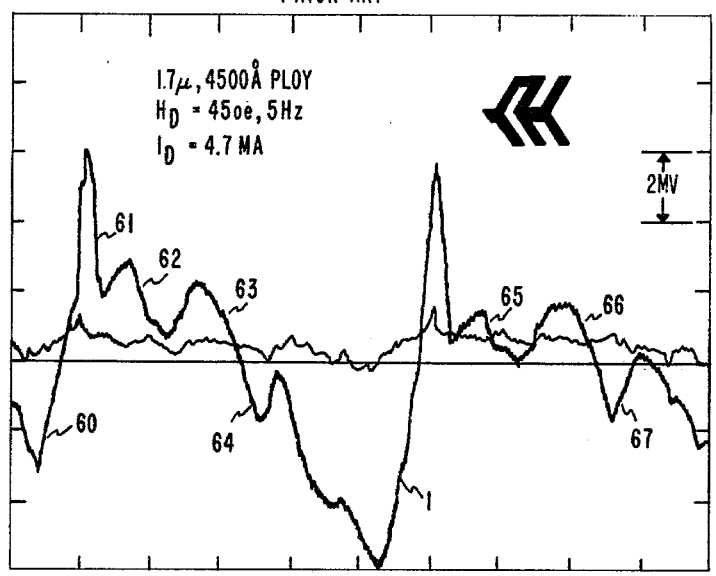
FIGS. 6 and 7 show graphs of output waveforms from a typical prior art detector and from a detector of the type shown in FIGS. 2-5, respectively.

Each chevron element of FIGS. 2 through 5 is assumed, illustratively, to form a ninety-degree angle. That is to say each chevron element has two legs joining at a peak and forming a ninety-degree angle therebetween. It is characteristic of an elongated permalloy element, such as one of those legs, to become magnetized in a first direction by a field aligned with its long dimension and to be magnetized in a second direction when that field is reversed. For a magnetic field rotating in the plane of those elements, a field oriented perpendicular to a leg no longer acts to magnetize that leg. Rather, the leg remains magnetized in its previous state until the field rotates beyond that perpendicular orientation. When an elongated per malloy element such as a leg of a chevron element is positioned in a plane in which a drive field is rotating, the leg switches between its first and second states, twice each cycle. The problem with prior art permalloy expansion detectors for magnetic bubbles, as was indicated hereinbefore, is that the field which causes a leg to switch during a detection interval also causes the bubble strip to move to the position of that leg simultaneously. FIG. 6 shows an output of a typical permalloy detector for the parameters and geometry shown in the figure. Although a six-millivolt output (binary 1) signal is obtained, unwanted signals 60 through 67 also appear. Because of the presence of these signals, quadrature output organization of several detectors on a chip, for example, is not possible.

Figure 7:
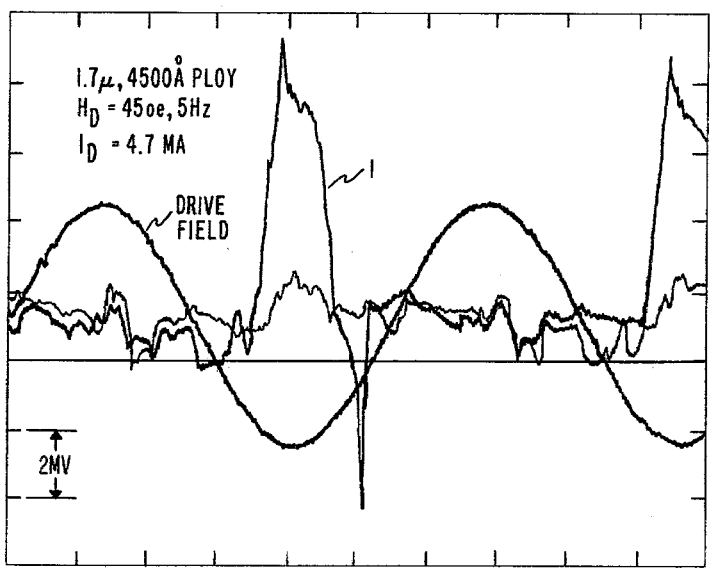

FIG. 7 shows an output typical of a like detector with chevron elements positioned as shown in FIGS. 2-5. Note that the parameters are the same as in FIG. 6. About 8 millivolt signals are obtained for the same 4.7 milliampere interrogate pulse ($I_D$). But the noise level is within a two millivolt range rather than within the four millivolt range as was the case with the prior art detectors. All the peaks 60 through 67 are eliminated. Note also that the 1.7 micron notation in FIGS. 6 and 7 refers to bubble diameter and thus, the present detectors are useful for below eight micron bubble circuits, as well as eight micron circuits.

The obvious signal improvement shown in FIG. 7 is achieved by positioning alternate chevron elements so that the upstream legs of those elements position the stretched bubble across the upstream legs of the remaining elements before the upstream legs of the remaining elements are switched by the rotating drive field.

It is to be understood that the main contribution to the magnetoresistive output comes from the upstream legs of those remaining elements. Specifically, an interrogate pulse is applied to detector 31 under the control of control circuit 17 when the drive field rotates counterclockwise past an orientation parallel to a downstream leg of element 44 in FIG. 4, as indicated by broken arrow 80 in that figure. The upstream legs of the contributing elements are of a width to optimize the magnetoresistive output as is well understood in the art. But the downstream legs of those elements and both legs of the odd-numbered elements can be wider to decrease resistance of the detector and thus reduce parasitic capacitance constraints on the detector circuit. The wide-narrow leg arrangement is shown in FIG. 4. by the light and heavy lines constituting the chevron elements.

Of course, the positioning of alternate elements different from the remaining elements while retaining the angle between the legs of all the elements constant results in the peaks of the alternate (odd-numbered) elements being positioned upstream of the peaks of the remaining elements. Thus, a characteristic of the detector of FIGS. 2 through 5 is that the peaks of the odd-numbered chevron elements are upstream of the peaks of the even-numbered elements.

As is customary of magnetic bubbles, the diameter of a bubble during operation is maintained at a nominal operating diameter by a bias antiparallel to the magnetization of the bubble. Bubble materials (layer 11) are formed as a single crystal by epitaxial deposition onto a nonmagnetic substrate and have a uniaxial anisotropy normal to the plane of layer 11. A bubble thus has its magnetization along that normal axis, and the bias field also is directed along that axis, but in the opposite direction. The bias field is supplied by a permanent magnet in practice and is represented by block 70 of FIG. 1.

Figure 8:
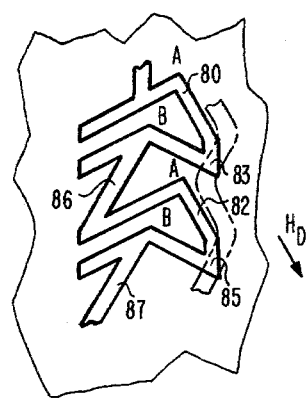
FIGS. 8, 9, 10, and 11 show enlarged top views of portions of an alternative detector arrangement for a memory of the type shown in FIG. 1.

FIGS. 8, 9, 10, and 11 show enlarged top views of portions of an alternative detector for the memory of FIG. 1. In this case, even-numbered elements 80 and 82 are positioned so that the peaks of those elements lie along an axis further upstream (to the right as viewed) of the peaks of odd-numbered elements 83 and 85 as shown in FIG. 8. In this embodiment, additional downstream legs 86 and 87 are present. The additional downstream legs, along with upstream legs of elements 83 and 85, form third chevron elements positioned at still a third angle $\Phi$, with respect to the axis of bubble propagation indicated by arrow 90 in FIG. 9.

The embodiment of FIGS. 8 through 11 operates essentially the same as the embodiment of FIGS. 2 through 5. The added downstream legs increase the amount of permalloy present in the detector and increase the pole strength at the upstream ends of the upstream legs of the detector elements in order to allow operation at relatively low drive fields. The added legs also operate to strengthen the upstream poles to enable the stretched bubble to be moved to the detector more easily at high bias fields.

Figure 9:
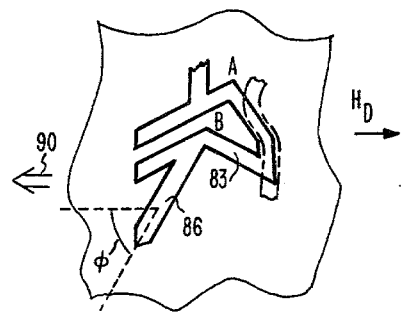
Figure 10:
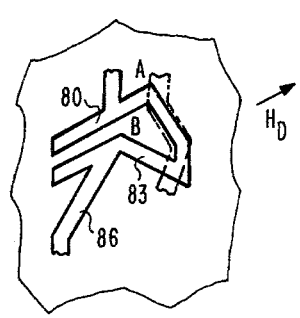
Figure 11:
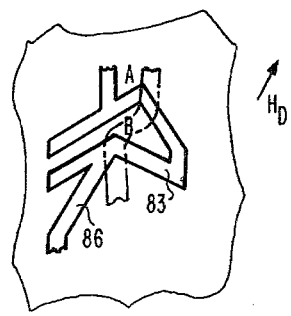

The positions of the stretched bubble and the corresponding drive field ($H_D$) orientations are shown in FIGS. 8 through 11. Once again, it is clear that for field ($H_D$) orientation as shown in FIGS. 9 and 10, the upstream legs of even-numbered elements are intersected by the bubble before switching of those even-numbered legs occurs during a detection interval. The positions of the bubble before and after the interrogate pulse occurs are shown in FIGS. 10 and 11, respectively.

In one specific embodiment of this invention, a detector of the type shown in FIGS. 2 through 5 was defined by permalloy 83% iron-17% nickel. Propagation elements and detector elements 4500 Angstrom units thick and having a period of sixteen microns ($\mu$) were defined during the same deposition and photolithography process. The detector chevron elements were two $\mu$ wide in this embodiment. The bubble material was YSm-LuCa-GeIG having 1.7 $\mu$ bubbles. The rotating (drive field) was 45 oesteds, the interrogate pulse was 4.7 milliamperes, and operation was at 5 Hz to facilitate testing. A dummy detector was positioned two stages from the operating detector in order to provide a set of normal chevron elements to either side of the operating and dummy detectors to ensure a like magnetic environment for each. The operating detector and the dummy were connected electrically into a bridge arrangement as is now common in magnetic bubble memories.

What has been described is considered merely illustrative of the principles of this invention. Consequently, various modifications can be devised by those skilled in the art in accordance with those principles within the spirit and scope of this invention as encompassed by the following claims. For example, chevron detector elements are conveniently formed along with the elements of the bubble propagation path. In this case, all the elements are of permalloy and of like thickness. But, a detector as described herein also can be used in conjunction with ion-implanted propagation paths.

I claim:

1. A magnetic bubble memory including a layer of material in which magnetic bubbles can be moved along a propagation path to a detector stage, said detector stage comprising a plurality of elements of magnetically soft elements stacked along an axis transverse to said path and interconnected to provide an electrically conducting path for currents applied thereto, alternate ones of said plurality of elements being oriented at a first angle with respect to the axis of said propagation path, the remaining ones of said plurality being oriented at a second angle greater than said first angle.

2. A magnetic bubble memory in accordance with claim 1 wherein each of said plurality of elements is chevron-shaped having an upstream and a downstream leg connected at a peak wherein the peaks of said alternate ones of said plurality of elements lie along a line further upstream than a line along which the peaks of said remaining ones of said plurality of elements lie.

3. A magnetic bubble memory in accordance with claim 2 wherein the legs of each of said chevron elements form a 90 degree-angle at said peak.

4. A magnetic bubble memory in accordance with claim 3 wherein the upstream legs of said remaining ones of said plurality of elements and of a first width to optimize the magnetoresistive effect of said detector, and the remaining legs of said plurality of elements are of a second width greater than said first width for reducing the resistance of said detector.

5. A magnetic bubble memory in accordance with claim 2 wherein said propagation paths and said detector arrangement are formed of permalloy of like thickness.

6. A magnetic bubble memory in accordance with claim 4 wherein said propagation paths are defined also by permalloy elements and said elements of said propagation paths, and said plurality of elements have an identical thickness.

7. A detector for a magnetic bubble moving along a propagation path, said detector including a plurality of like chevron-shaped elements interconnected to form an electrically conducting path astride said propagation path and comprising alternate elements positioned at a first angle with respect to the axis of said propagation path, and the remaining ones of said elements being positioned at a second angle greater than said first angle.

* * * * *